United States Patent [19]

Yamamoto

[11] 3,890,637

[45] June 17, 1975

[54] SEMICONDUCTOR ELEMENT ENVELOPE

[75] Inventor: Isamu Yamamoto, Itami, Japan

[73] Assignee: Mitsubishi Denki Kabushiki Kaisha, Tokyo, Japan

[22] Filed: Jan. 17, 1974

[21] Appl. No.: 434,117

[30] Foreign Application Priority Data

Jan. 25, 1973 Japan .............................. 48-11315

[52] U.S. Cl. ...................... 357/74; 357/72; 357/76; 357/79

[51] Int. Cl. ............................ H01l 3/00; H01l 5/00

[58] Field of Search .................. 317/234, 4, 3, 6, 11

[56] References Cited

UNITED STATES PATENTS

| | | | |
|---|---|---|---|
| 3,265,805 | 8/1966 | Carian et al. | 317/234 P |
| 3,443,168 | 5/1969 | Camp et al. | 317/234 P |
| 3,721,867 | 3/1973 | Schierz | 317/234 P |

FOREIGN PATENTS OR APPLICATIONS

| | | | |
|---|---|---|---|
| 1,172,940 | 10/1968 | United Kingdom | 317/234 P |

*Primary Examiner*—Andrew J. James

*Attorney, Agent, or Firm*—Wenderoth, Lind & Ponack

[57] ABSTRACT

A semiconductor element is resiliently held in an annular member of elastic, electrically insulating material having its inside diameter somewhat smaller than the diameter of the element. The annular member is provided at each end with an annular engaging portion having circumferential fins disposed at its outer and inner peripheral edges. One electrode block is fitted into each open end portion of the annular member until it is in compressive contact with the semiconductor element while the fins are spread out on an annular surface on the electrode block to form a more complete hermetic seal between the engaging portion of the annular member and each electrode block.

10 Claims, 9 Drawing Figures

SEMICONDUCTOR ELEMENT ENVELOPE

BACKGROUND OF THE INVENTION

This invention relates to a semiconductor device and more particularly to improvements in an envelope for accommodating a semiconductor element therein.

There are widely used semiconductor devices called the "flat package type". Where many semiconductor devices are required to be assembled into a single unit, the flat package type of semiconductor device is particularly useful. This is because a multitude of such semiconductor devices are permitted to be stacked on one another with one heat dissipation block interposed between each pair of adjacent semiconductor devices. The conventional type of flat package semiconductor device includes an annular member of hard, electrically insulating material such as a ceramic material, the semiconductor element disposed within the interior of the annular member, and a pair of electrode blocks disposed so as to close both open ends of the annular member, respectively. The annular members form an envelope for the semiconductor element with the pair of electrode blocks.

That semiconductor element used with the envelope of the type referred to has included a wafer of semiconductive material such as silicon, for example in the form of a thin disc having a P-N junction or junctions disposed therein, and a reinforcing member formed, for example, of molybdenum and brazed to the wafer. That portion of the surface of the wafer to which the P-N junction or junctions are exposed has been particularly coated with silicone wax to prevent the external atmosphere from affecting the surface portion of the wafer. However that silicone wax does not completely eliminate the effect of the external atmosphere upon the surface portion of the wafer having the P-N junction or junctions exposed thereto. This has resulted in the necessity of constructing the envelope so that the semiconductor element disposed in the envelope is perfectly sealed up from the external atmosphere. The perfect sealing has required a troublesome hermatic structure.

More specifically, it has been usually practiced to dispose an annular diaphragm between each open end of the annular member and the adjacent electrode block and to braze the diaphragm at one edge to the annular member and at the other edge to the electrode block for sealing purposes. In this measure, the diaphragm has been joined on an annulus to each of the annular member and electrode block. Thus it has been necessary to precisely effect the brazing along the joined surface so as not to break the hermetically sealed portions on the joined surfaces. But such brazing has been difficult. Also, since the annular member has been of an electrically insulating material, for example, a ceramic material, it has been impossible to braze the diaphragm directly to the annular member. This has led to the necessity of first metallizing that portion of the annular member to be brazed and then brazing the diaphragm to the metallized portion of the annular member, resulting in a complicated operation.

On the other hand, semiconductor elements have been increasingly improved. For example, there have been proposed materials capable of more perfectly sealing up the exposed edge of the P-N junction from the external atmosphere. Examples of such a material involve silicon nitride, glass etc. If semiconductor elements are coated for example, with silicon nitride or glass film then one will have no interest in the envelope having the troublesome sealing structure as above described.

It is an object of the present invention is to provide a new and improved semiconductor device including an envelope exhibiting the satisfactory hermetic sealing effect with a simplified structure as compared with envelopes previously available.

SUMMARY OF THE INVENTION

The present invention provides a semiconductor device comprising an annular member formed of elastic, electrically insulating material including a main portion in the form of a hollow cylinder and an annular engaging portion disposed at least at one end of the main cylindrical portion, the engaging portion including at least one annular fin; a semiconductor element including a wafer of semiconductive material having at least one P-N junction disposed therein and disposed on the inner peripheral surface of the annular member; and a pair of electrode blocks forming an envelope for the semiconductor element with the annular member, each of the electrode blocks including a surface portion, each of the electrode blocks being disposed in contact with the semiconductor element while the surface portion of the electrode block is in engagement with the engaging portion on the annular member so that the annular fin is spread out on the surface portion of the associated electrode block, whereby the semiconductor element is hermetically sealed up between the annular fin and the surface portion of each of the electrode blocks.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
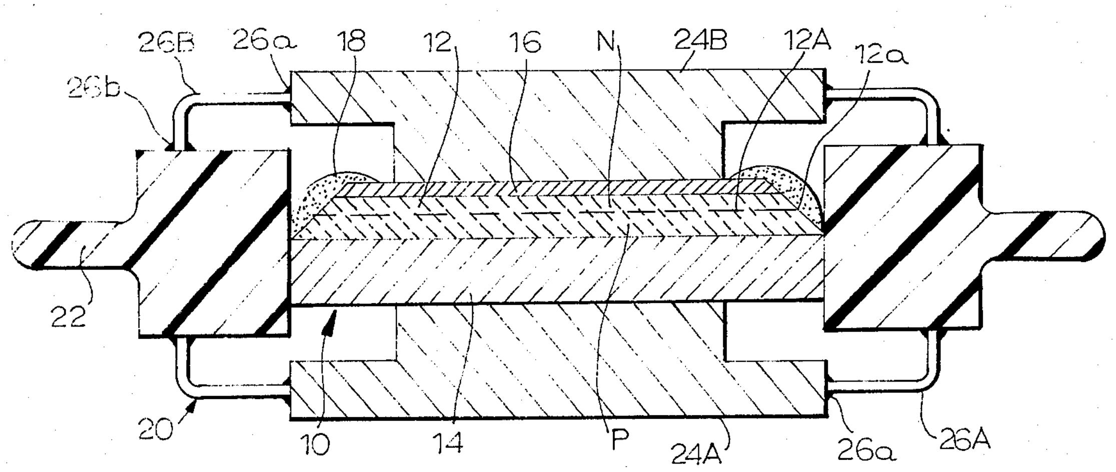
(PRIOR ART) FIG. 1
FIG. 1 is a sectional view of a flat package type semiconductor device constructed in accordance with the principles of the prior art.

Referring now to the drawings and FIG. 1 in particular, there is illustrated a conventional semiconductor device of the flat package type. The arrangement illustrated comprises a semiconductor element generally designated by the reference numeral 10 and an envelope generally designated by the reference numeral 20. The semiconductor element 10 includes a wafer 12 of semiconductive material such as silicon having a pair of main opposite faces and a reinforcing plate 14 brazed on one of the main faces, in this case, a lower face as viewed in FIG. 1 of the wafer 12. The wafer 12 includes a P type region and an N type region forming therebetween a P-N junction 12A having a peripheral edge 12*a* exposed to the tilted peripheral surface of the wafer 12. The reinforcing plate 14 is disposed in ohmic contact with the lower P type region of the wafer 12 and an electrode layer 16 is disposed in ohmic contact with the upper N type region of the wafer 12. A layer 18 of silicone wax is shown in FIG. 1 as coating the exposed portion of the upper main face and the peripheral surface of the wafer 12 and therefore the exposed edge 12*a* of the P-N junction 12A.

The envelope 20 includes an annular member 22, a pair of electrode blocks 24A and 24B disposed on both open end portions of the annular member 22 and one annular diaphragm 26A or 26B having an inner peripheral edge 26*a* brazed at 26*a* to the adjacent electrode block 24A or 24B on the peripheral surface and an outer folded edge brazed at 26*b* to the lower or upper surface of the annular member 22. The lower and upper diaphragms 26A and 26B respectively serve to maintain the mating electrode blocks 26A and 26B in pressure contact with the reinforcing place 14 and the electrode layer 16, respectively. Thus the semiconductor element 10 is hermetically maintained in place within the envelope 20.

It will be appreciated that the arrangement of FIG. 1 is of a complicated structure and can be constructed only by troublesome operations. More specifically, each diaphragm 26A or 26B is brazed in an annular line to either of the annular member 22 and the electrode block 24A or 24B. However it is difficult to effect the precise brazing in an annular line so as to prevent the hermetic seal from breaking in the annular line during service. Also since the annular member 22 is of an electrically insulating material, the same is required to be metallized, after which the metallized portion thereof is brazed to the associated diaphragm.

The present invention contemplates to simplify the hermetically sealing structure for semiconductor elements.

Figure 2:
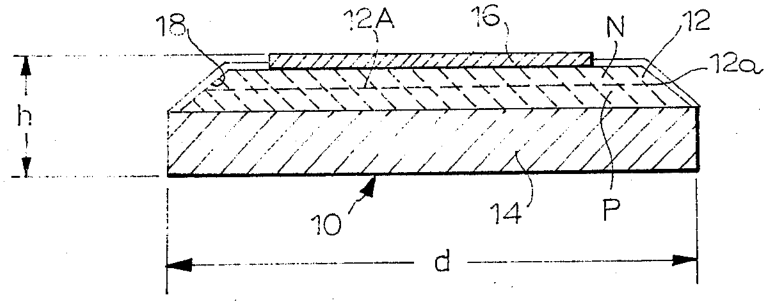
FIG. 2 is a sectional view of a semiconductor element suitable for use with a semiconductor device constructed in accordance with the principles of the present invention.

Referring now to FIG. 2 wherein like reference numerals designate the components identical or similar to those shown in FIG. 1, there is illustrated a semiconductor element suitable for use with the present invention. The semiconductor element 10 is shown in FIG. 2 as including a wafer 12 of semiconductive material such as silicon in a frustoconical shape having a pair of main opposite faces and a P-N junction 12A formed between an upper N region and a lower P region thereof by using the diffusion or epitaxial growth technique as well known in the art. Thus the wafer 12 is formed into a semiconductor diode. A reinforcing plate 14 in the form of a disc is composed of molybdenum or tungsten and disposed in ohmic contact with the lower region of the wafer 12 by brazing, and an electrode layer 16 formed, for example, of aluminum is fixed on the central portion of the upper main face of the wafer 12 to be in ohmic contact with the upper region thereof.

The P-N junction 12A includes a peripheral edge 12*a* exposed to the tilted peripheral surface which is, in turn, coated with an inert passivation film 18 as is that portion of the upper main face of the wafer 12 having disposed thereon no electrode layer 16. Thus the exposed edge 12*a* of the P-N junction 12A is coated with the passivation film 18.

The passivation film 18 may be formed on the wafer by pyrolyzing silane to produce silicon, converting the silicon to silicon nitride through the reaction on nitrogen gas and depositing the silicon nitride on the wafer in the well known manner. Alternatively, pulverized glass may be attached to the wafer and then heated to form a non-porous glass film on the latter which is also well known in the art. The passivation film 18 ensures that the surface of the wafer and more particularly the exposed edge 12*a* of the P-N junction 12A is hermetically sealed from the external atmosphere.

The semiconductor element 10 is also shown in FIG. 2 as having a maximum diameter of $d$ equal to a predetermined diameter of the reinforcing disc 14 and a thickness of $h$ corresponding to a predetermined length between the upper surface of the electrode layer 16 and the lower surface of the reinforcing disc 14. The maximum diameter $d$ may range from 20 to 60 mm, and the thickness $h$ may range from 1 to 5 mm. In the example illustrated, the diameter $d$ is of 30 mm, and the thickness $h$ is of 3 mm.

Figure 3A:
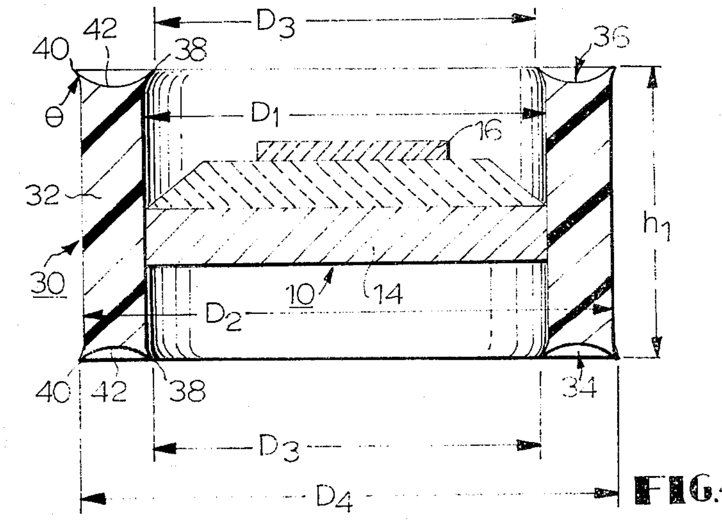
FIG. 3*a* is a sectional view of an annular member constructed and operatively connected to the semiconductor element of FIG. 2 in accordance with the principles of the present invention.
Figure 3B:
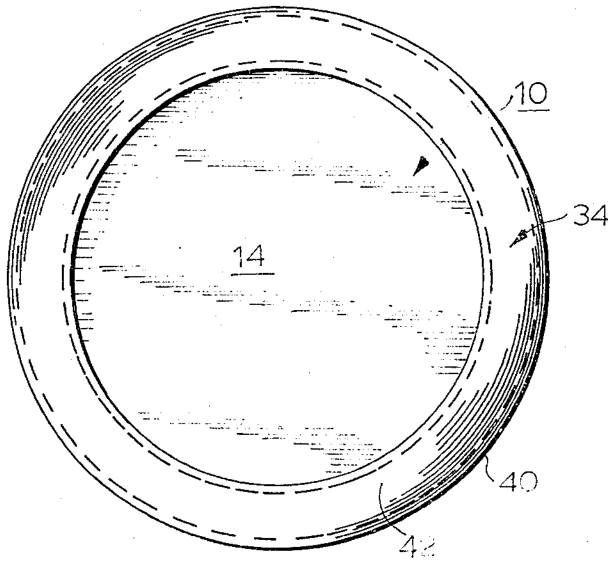
FIG. 3*b* is a plan view of the lower end surface of the annular member shown in FIG. 3*a;*

Referring now to FIGS. 3*a* and 3*b*, there is illustrated an annular member for accommodating a semiconductor element therein constructed in accordance with the principles of the present invention. The arrangement illustrated comprises an annular member generally designated by the reference numeral 30 and including a main portion 32 in the form of a hollow cylinder, and an annular engaging portion 34 or 36 formed on either of the lower and upper annular surfaces of the main portion 32. All the main portion 32 and the engaging portions 34 and 36 are integrally formed of any suitable electrically insulating material having an appropriate elasticity. Such a material is preferably synthetic rubber, for example, silicone rubber or fluorin-contained rubber.

The main cylindrical portion 32 has an inside diameter $D_1$ remaining unchanged from the upper to the lower end thereof. The inside diameter $D_1$ is predetermined to be equal to $(0.98 - 0.95)d$ where $d$ is the maximum diameter of the semiconductor element as above described in conjunction with FIG. 2.

The semiconductor element as shown in FIG. 2 is forcedly inserted into the annular member 30 in the manner as shown in FIG. 3*a*. Since the inside diameter $D_1$ of the main cylindrical portion 32 is smaller than the maximum diameter $d$ of the semiconductor element by a factor of from 2 to 5 percent of the diameter $d$ as above described, the insertion of the semiconductor element 10 into the annular member 30 causes the main portion 32 to be elastically deformed to increase its inside diameter. Then, the elasticity due to this deformation of the main portion 32 is effective for resiliently holding the semiconductor element 10 in place within the annular member 30. This eliminates not only the necessity of using any special holder in order to hold the semiconductor element during the assembling operation but also it is effective for holding the semiconductor element in the annular member so as to cause the center of the semiconductor element 10 to coincide with that of the annular member 30.

The annular member 30 has its outside diameter $D_2$ also remaining unchanged from the upper to the lower end thereof. This outside diameter $D_2$ of the annular member 30 is not particularly critical, and in the example illustrated, the diameter $D_2$ has been selected to be greater by about 6 mm than the inside diameter $D_1$ of the annular member 30.

The annular engaging portions 34 and 36 provided on the lower and upper ends of the main cylindrical portion 32, respectively, are substantially of the same construction, and only one thereof, for example, the lower engaging portion 34 will now be described. As best shown in FIG. *3b*, the lower annular engaging portion 34 includes a pair of annular fins 38 and 40 radially inwardly and outwardly extending from the inner and outer peripheral edges of the lower end of the main cylindrical portion 32 respectively and also axially projecting therefrom as shown in FIG. *3a*. Both annular fins 38 and 40 have respective external surfaces 42 merged into an annular recessed surface formed on the annular lower end of the main cylindrial portion 32 to form a cresent concave axially externally.

As shown in FIG. *3a*, the inner annular fin 38 has an inside diameter $D_3$ smaller than the inside diameter $D_1$ of the main cylindrical portion 32 while the outer annular fin 40 has an outside diameter $D_4$ greater than the outside diameter $D_2$ of the main cylindrical portion 32 with the difference between the diameters $D_3$ and $D_1$ substantially equal to the difference between the diameters $D_4$ and $D_2$. It has been found that this difference in diameter should be equal to a radial dimension or a thickness of $D_2$–$D_1$ of the annular member 30 divided by a factor of from 1.5 to 10 to achieve satisfactory results. Each of the fins 38 and 40 includes an extremity pointed to form an angle $\theta$ preferably ranging from about 30° to 40°.

As an example, the annular member 30 shown in FIGS. *3a* and *3b* has been constructed with the following dimensions:

Difference between Outside and Inside Diameters
$D_2 - D_1 = 6$ mm (Ca)
Difference between Diameters
$D_1 - D_3 = D_4 - D_2 = 1.5$ mm
Angle of Fin $\theta = 45°$
Distance between Extremities of Upper and Lower Fins 36 and 34 $h = 9$ mm.

Figure 4:
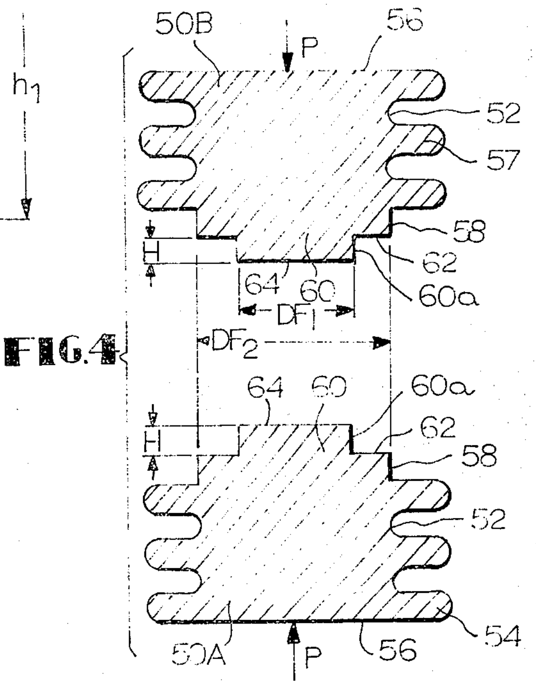
FIG. 4 is a sectional view of a pair of electrode blocks constructed in accordance with the principles of the present invention.

In FIG. 4 there are illustrated a pair of electrode blocks suitable for use with the arrangement as shown in FIGS. *3a* and *3b*. The electrode blocks are generally designated by the reference numerals 50A and 50B, respectively, and are of the same construction. Therefore only one of them, designated 50A, will now be described, while the components of the other electrode block 50B are denoted by the same reference numerals as the corresponding components of the electrode block 50A. The electrode block 50A is in the form of a cylinder having peripheral surface 52 from which a plurality of circumferential cooling fins 54 radially extend in spaced parallel relationship. One end portion, in this case, the lower end portion as viewed in FIG. 4 of the electrode block 50A terminates at the lowermost cooling fin 54, forming an end surface 56. The other or upper end portion of the electrode block 50A includes a stepped cylindrical portion having a peripheral cylindrical surface 58 and a protrusion 60 in the form of a cylinder centrally and coaxially extending from the cylindrical portion to leave an annular surface 62 on the latter. The protrusion 60 includes an end surface 64 and a peripheral cylindrical surface **60*a* having a diameter of $DF_1$ and an axial dimension of H. The peripheral surface 58 has a diameter of $DF_2$, greater than that of the protrusion 60, and a first one of the cooling fins 54 is connected to that end thereof remote from the protrusion 60.**

In the arrangement of FIG. 4, the peripheral surfaces 52, 58 and **60*a* are coaxial with the longitudinal axis of the electrode block 50A and the end surfaces 56 and 64 and the annular surface 62 are flat in respective planes normal to that longitudinal axis. The electrode block 50B is shown as having its protrusion 60** disposed on the lower end portion thereof.

The annular surface 62 is adapted to be engaged by the engaging portion 34 or 36 as shown in FIG. *3a* as will be described hereinafter. It is noted that the diameter $DF_1$ of the protrusion 60 is smaller than the diameter $D_3$ of the inwardly directed fin 38 as shown in FIGS. *3a* or *3b* and greater than the diameter of the electrode layer 16 as shown in FIG. 2. On the other hand, the diameter $DF_2$ of the cylindrical surface 58 is selected to be greater than the diameter $D_4$ of the outwardly directed fin 40.

With the annular member 30 of FIGS. *3a* and *3b* having the dimension as above specified, the diameter $DF_1$ is 3 mm smaller than the diameter $D_3$ and the diameter $DF_2$ is 10 mm greater than the diameter $D_4$ with the protrusion 60 having the axial dimension H of 2 mm.

Figure 5:
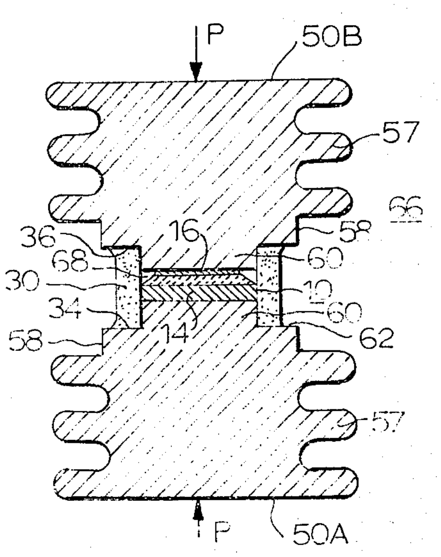
FIG. 5 is a sectional view of a semiconductor device constructed in accordance with the principles of the present invention.

Referring now to FIG. 5, wherein like reference numerals designate the components identical to those shown in FIG. 3 and FIG. 4, there is illustrated a semiconductor device having the semiconductor element 10 as shown in FIG. 2, the annular member 30 as shown in FIGS. *3a* and *3b* and the pair of electrode blocks 50A and 50B as shown in FIG. 4 operatively interconnected into a unitary structure.

As shown in FIG. 5, the pair of electrode blocks 50A and 50B are fitted into the annular member 30 from the lower and upper open ends respectively and have a pair of opposite forces P axially applied thereto to be forced toward each other. As a result, the end surfaces 64 of the electrode blocks 50A and 50B abut against the reinforcing disc 14 and the electrode layer 16 of the semiconductor element 10 under pressures, respectively, whereby the semiconductor element 10 is held between the end surfaces 64 of the electrode blocks 50A and 50B. At the same time, the annular member 30 cooperates with the electrode blocks 50A and 50B to form an envelope for the semiconductor element 10 generally designated by the reference numeral 66. The envelope 66 includes therein a hermetically closed space 68 wherein the semiconductor element 10 is maintained in place.

Since the protrusion 60 on back electrode block 50A or 50B is H high and the semiconductor element 10 is $h$ thick, a distance $h_2$ between the annular surfaces 62 on the electrode blocks 50A and 50B is equal to 2H + $h$, that is, $h_2 = 2H + h$. With H and $h$ having the values as above specified, $h_2$ has a value of 7 mm. On the other hand, the height $h_1$ of the annular member has a value of 9 mm as above described. That is, the height $h_1$ of the annular member 30 is greater than the distance $h_2$ between annular electrode surfaces 62. This means that, in its assembled position, the annular member 30 is maintained axially compressed so that the fins 38 and 40 are spread out on and engaged by the adjacent annular surfaces 62. In that event, it will readily be understood that the inwardly directed fin 38 is spread out on the adjacent annular surface 62 toward the inner periphery thereof while the outwardly directed fin 40 is spread out on the associated annular surface 62 toward the outer periphery thereof. This spreading-out of the fins 38 and 40 on the respective annular surfaces 62 ensures that the hermetic sealing between the engaging portions 34 and 36 and the electrode blocks 50A and 50B is more completely accomplished. It has been found that $h_1$ should be generally equal to from 1.2 to 1.3 times $h_2$ in order to spread the fins 38 and 40 out on the associated annular surfaces 62.

It is essential that, in their assembled positions, the annular fins 38 and 40 are maintained spread out on the respective annular surfaces 62 for the following reasons: When the annular fins 38 and 40, small in thickness, are pushed against the respective annular surfaces 62, the fins are readily deformed to intimately contact the annular surfaces 62 even though these surfaces might be somewhat irregular. This improves the sealing effect. Also, pressure within the closed space 68 is increased with the conduction of the semiconductor element 10. This increase in pressure within the closed space 68 results in a tendency to further spread the fins 38 out toward the inner periphery of the annular member 30 because the fins 38 have been already done so. This also results in an additional improvement in the sealing effect. This is also true in the case the ambient pressure is increased. In the latter event, it is noted that the outwardly directed fin 40 rather than the inwardly directed fin 38 is additionally spread out on the associated annular surface 62.

Therefore it will be appreciated that, due to the improvement in the sealing effect, semiconductor devices of the present invention can to be operated in any atmosphere, including a highly corrosive gas or gases, in any gas including a great number of dust particles, or in any atmosphere high in pressure.

The closed space 68 within the envelope 66 is preferably filled with clean air, or an inert gas such as gaseous nitrogen or sulfur hexafluoride ($SF_6$). If desired, the space 68 may be filled with any suitable liquid not contaminating the semiconductor element 10, for example, an oil. By filling the space 68 with such a liquid, the sealing effect can be improved as compared with the rise of an inert gas. This is because liquids have higher coefficients of thermal expansion than gases, which reduces the increase in pressure within the closed space 68 during the conduction of the semiconductor element 10. The improvement in the sealing effect can additionally attribute to a decrease in the amount of a filling liquid leaking from the closed space 68 because the smaller the viscosity of a fluid filling the space 68 the larger the amount of the fluid leaking from the space and because liquids are generally larger in viscosity than gases.

Figure 6A:
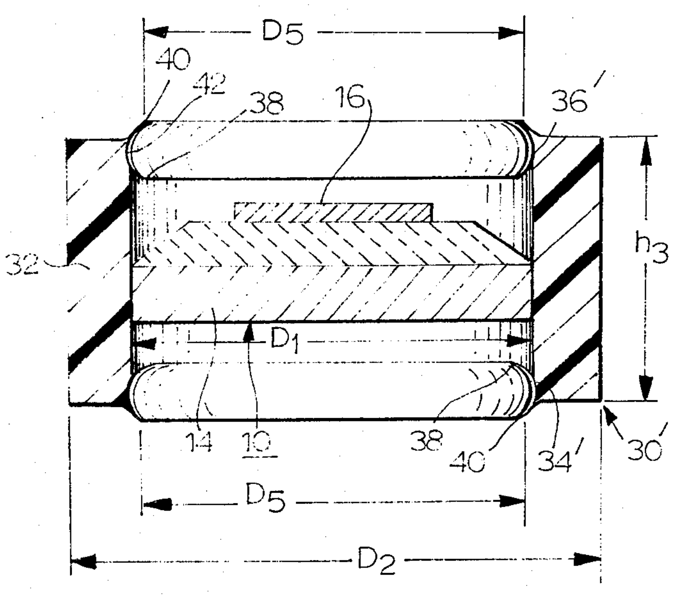
FIGS. 6*a* and 6*b* are views similar to FIGS. 3*a* and 3*b* respectively but illustrating a modification of the annular member shown in FIGS. 3*a* and 3*b.
Figure 6B:
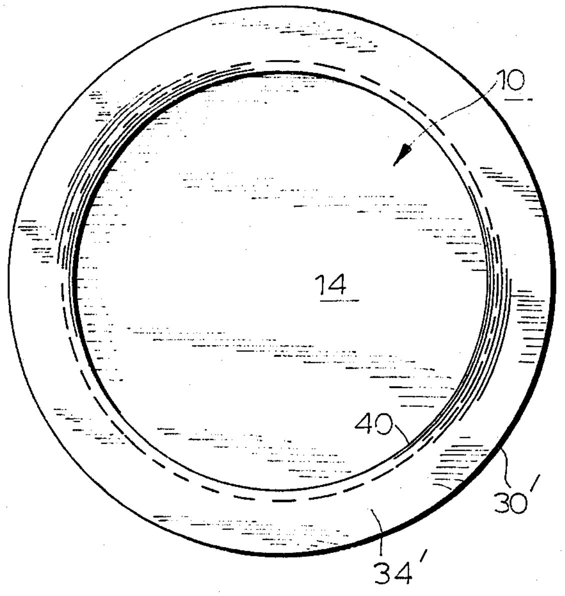

FIGS. 6*a* and 6*b* shows a modification of the annular member 30 as shown in FIGS. 3*a* and 3*b*. The arrangement illustrated includes a pair of lower and upper engaging portions 34' and 36' directed inwardly in the radial direction of the annular member 30' but not axially thereof. Thus the annular fins 38 and 40 are radially inwardly directed with respect to the longitudinal axis of the annular member 30'. In other respects, the arrangement is substantially similar to that shown in FIGS. 3*a* and 3*b* and like reference numerals have been employed to identify the components corresponding to those shown in FIGS. 3*a* and 3*b*. In other words, the arrangement as shown in FIGS. 6*a* and 6*b* can be formed by radially inwardly folding both end portions of the annular member 30 as shown in FIGS. 3*a* and 3*b*. As a result, all the annular fins 38 and 40 are positioned on the side of the inner peripheral surface of the annular member 30'.

In the arrangement as shown in FIGS. 6*a* and 6*b*, the outside diameter $D_2$ of the annular member 30', the inside diameter $D_5$ of the inner peripheral edge of each fins 38 or 40 and a distance $h_3$ between the extremities of the two outermost fins 40 are important parameters instead of $D_4$, $D_3$ and $h$, shown in FIG. 3*a*. It has been found that, with satisfactory results, $D_5$ should be smaller than $DF_1$, by from 20 to 30 percent of the latter and $h_3$ should be less than twice H plus $h$. That is;

$D_5 = (0.7 \sim 0.8)\ DF_1$ and $h_3 < 2H + h$ should obtain.

Figure 7:
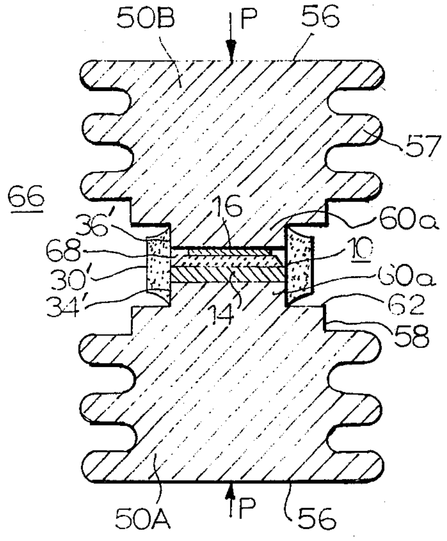
* and FIG. 7 is a sectional view of another semiconductor device constructed in accordance with the principles of the present invention.

The annular member 30' as shown in FIGS. 6*a* and 6*b* can be operatively associated with the electrode blocks 50A and 50B as shown in FIG. 5 to form a semiconductor device as illustrated in FIG. 7, wherein like reference numerals designate the components identical to those shown in FIGS. 4 and 6.

As shown in FIG. 7, the annular member 30' has the annular engaging portions 34' and 36' engaged by the peripheral surfaces 60*a* of the protrusions 60 in a direction orthogonal to the direction in which the semiconductor element 10 is in pressure contact with the electrode blocks 50A and 50B, as compared with the annular member 30 having the annular engaging portions 38 and 40 engaged by the annular surfaces 62 in a direction similar to the direction in which the semiconductor element 10 is in pressure contact with the electrode blocks 50A and 50B, as shown in FIG. 5. Only in this respect is the arrangement of FIG. 7 essentially different from that shown in FIG. 5.

While the present invention has been illustrated and described in conjunction with a few preferred embodiments thereof, it is to be understood that various changes and modifications may be resorted to without departing from the spirit and scope of the present invention. For example, the annular member may have one of the annular fins 38 and 40 omitted therefrom. Also the annular member may be provided on the outer peripheral surface with a plurality of spaced parallel ridges for increasing a resistance to creep discharge between the opposite electrode blocks in their assembled positions. Further the semiconductor element may comprise a transistor or a thyristor with the electrode blocks modified accordingly.

What is claimed is:

1. A semiconductor device comprising, in combination, an annular member of elastic, electrically insulating material including a main portion in the form of a hollow cylinder and an annular engaging portion disposed at least at one end of said main cylindrical portion, said engaging portion including at least one annular fin integrally formed with said main portion; a semiconductor element including a wafer of semiconductive material having at least one P-N junction disposed therein and contacting the inner peripheral surface of said annular member; and a pair of electrode blocks forming an envelope for the semiconductor element with said annular member, each of said electrode blocks including a surface portion, each of said electrode blocks being disposed in contact with said semiconductor element while said surface portion of said electrode block is in engagement with said engaging portions on said annular member so that said annular fin is spread out on said surface portion of the associated electrode block, whereby the semiconductor element is hermetically sealed up between said annular fin and said surface portion of each of the electrode blocks.

2. A semiconductor device as claimed in claim 1 wherein said annular member is formed of a synthetic rubber.

3. A semiconductor device as claimed in claim 1 wherein said electrode blocks are in contact with said semiconductor element along the longitudinal axis of said annular member and under pressure.

4. A semiconductor device as claimed in claim 3 wherein said surface portion of each of said electrode blocks lies in plane substantially normal to the longitudinal axis of said annular member.

5. A semiconductor device as claimed in claim 3 wherein said surface portion of each of said electrode blocks is formed of a cylindrical surface coaxial with the longitudinal axis of said annular member.

6. A semiconductor device as claimed in claim 4 wherein said annular fin is disposed along the inner peripheral edge of said annular engaging portion and spread out toward the interior of said envelope.

7. A semiconductor device as claimed in claim 4 wherein said annular fin is disposed along the outer peripheral edge of said annular engaging portion and spread out toward the exterior of said envelope.

8. A semiconductor device as claimed in claim 1 wherein said annular engaging portion has disposed along the inner and outer peripheral edges thereof a pair of first and second annular fins spread out toward the interior and exterior of said envelope respectively and wherein said engaging surface lies in a plane substantially normal to the longitudinal axis of said annular member.

9. A semiconductor device as claimed in claim 5 wherein said annular engaging portion is folded radially inwardly of the longitudinal axis of said annular member and provided on the end portion thereof with said annular fin.

10. A semiconductor device as claimed in claim 1 wherein said semiconductor element has a diameter greater than the inside diameter of said main cylindrical portion of said annular member and is held on the inner peripheral surface of said main cylindrical portion due to an elastic deformation of the latter.

* * * * *